United States Patent [19]
Berger et al.

[11] Patent Number: 5,973,626
[45] Date of Patent: Oct. 26, 1999

[54] BYTE-BASED PREFIX ENCODING

[75] Inventors: Toby Berger, Ithaca, N.Y.; Yi-Jen Chiu, Holmdel, N.J.; Mikio Kawahara, Tokyo, Japan

[73] Assignee: Cornell Research Foundation, Inc., Ithaca, N.Y.

[21] Appl. No.: 09/042,509

[22] Filed: Mar. 17, 1998

[51] Int. Cl.$^6$ .............................. H03M 7/40; H03M 7/00
[52] U.S. Cl. ................................ 341/65; 341/67; 341/106
[58] Field of Search ................................ 341/65, 51, 67, 341/106, 50; 382/232; 360/40

[56] References Cited

U.S. PATENT DOCUMENTS

| | | | |
|---|---|---|---|
| 5,208,593 | 5/1993 | Tong et al. | 341/65 |
| 5,774,081 | 6/1998 | Cheng et al. | 341/107 |

FOREIGN PATENT DOCUMENTS

| | | |
|---|---|---|
| 582907 | 2/1994 | European Pat. Off. . |

OTHER PUBLICATIONS

Andrezej Sieminski, "Fast Decoding of the Huffman Codes," Information Processing Letters, pp. 237–241, (Jan. 11, 1988).

Shaw–Min Lei, "An Entropy Coding System for Digital HDTV Applications," IEEE Transactions on Circuits and Systems for Video Technology, vol. 1 (No. 1), pp. 147–155, (Mar. 1991).

Shih–Fu Chang et al., "Designing High–Throughput VLC Decoder, Part I–Concurrent VLSI Architectures," IEEE Transactions on Circuits and Systems for Video Technology, vol. 2 (No. 2), p. 187–196, (Jun., 1992).

Reza Hashemian, "Memory Efficient and High–Speed Search Huffman Coding," IEEE Transactions on Communications, vol. 43 (No. 10), pp. 2576–2581, (Oct., 1995).

Alistair Moffat, et al., "On the Implication of Minimum–Redundancy Prefix Codes," Proceedings of DCC 1996, pp. 170–179, (1996).

*Primary Examiner*—Michael Tokar
*Assistant Examiner*—Patrick Wamsley

[57] ABSTRACT

Two software-only prefix encoding techniques employ encoding look-up tables to produce contributions to the encoded bit stream that are incremented in integral numbers of bytes to facilitate accelerated encoding rates at the expense of an acceptable trade-off in increased memory size requirements. The first technique, referred to as offset-based encoding, employs encoding tables which eliminate most of the bit-based operations that need to be performed by a prefix encoder without inordinately expanding memory requirements. In offset-based encoding, a Huffman table is employed which contains information for each number of bits by which the length of a Huffman word is offset from an integral number of bytes. The encoding method generates bytes of encoded data, even though the Huffman code has variable length code words for each symbol to be encoded. The second technique, referred to as byte-based encoding, employs a byte-based Huffman encoding table which operates even faster than the offset-based encoding scheme because it does not employ any bit-based operations at all; however, this is achieved at the expense of a considerable expansion in memory requirements.

16 Claims, 8 Drawing Sheets

Table 1: General Huffman Table

| Symbol | Code | Length(bits) |
|---|---|---|
| ① | 0 | 1 |
| ② | 100 | 3 |
| ③ | 10100 | 5 |
| ④ | 10101 | 5 |
| ⑤ | 1011 | 4 |
| ⑥ | 11 | 2 |

FIG. 4

Table 3: Offset-based Huffman Table

| Symbol | ①(0) | | ⑤(1011) | | ⑥(11) | |
|---|---|---|---|---|---|---|
| Bit Length | 1 | | 4 | | 2 | |
| Offset | Unit Length | Code | Unit Length | Code | Unit Length | Code |
| 0 | 0 | 000 | 1 | 101 100 | 0 | 110 |
| 1 | 0 | 000 | 1 | 010 110 | 1 | 011 000* |
| 2 | 1 | 000 000* | 2 | 001 011 000* | 1 | 001 100 |

Table 4: Subtables for Different Offsets and Unit Conditions

| Subtable Number | Offset | Condition | | |
|---|---|---|---|---|
| ⓐ | 0 | – | – | – |
| ⓑ | 1 | 0 | – | – |
| ⓒ | 1 | 1 | – | – |
| ⓓ | 2 | 0 | 0 | – |
| ⓔ | 2 | 0 | 1 | – |
| ⓕ | 2 | 1 | 0 | – |
| ⓖ | 2 | 1 | 1 | – |

FIG. 7

Table 5: Example Byte-Based Huffman Table

| Subtable Number | ⓐ | | | ⓔ | | |
|---|---|---|---|---|---|---|
| Offset | 0 | | | 2 | | |
| Terminate Code | – | | | 010 | | |
| Symbol | Next Subtable | Unit Length | Codes | Next Subtable | Unit Length | Codes |
| ① | ⓑ | 0 | – | ⓐ | 1 | 010 |
| ② | ⓐ | 1 | 100 | ⓓ | 1 | 011 |
| ③ | ⓓ | 1 | 101 | ⓑ | 2 | 011 010 |
| ④ | ⓔ | 1 | 101 | ⓒ | 2 | 011 010 |
| ⑤ | ⓒ | 1 | 101 | ⓐ | 2 | 011 011 |
| ⑥ | ⓖ | 0 | – | ⓒ | 1 | 111 |

Table 2: Look-up Table with Clustering

| Value | root | | 9 | |
|---|---|---|---|---|
| | Length(bits) | Symbol | Length(bits) | Symbol |
| 000 | 1 | ① | 2 | ③ |
| 001 | 1 | ① | 2 | ③ |
| 010 | 1 | ① | 2 | ④ |
| 011 | 1 | ① | 2 | ④ |
| 100 | 3 | ② | 1 | ⑤ |
| 101 | 3 | 9 | 1 | ⑤ |
| 110 | 2 | ⑥ | 1 | ⑤ |
| 111 | 2 | ⑥ | 1 | ⑤ |

Table 6: Example Byte-based Look-up Table

| Node | root | | | 8 | | |
|---|---|---|---|---|---|---|
| Offset | 0 | | | 2 | | |
| Value | Next Subtable | Number of Symbols | Symbols | Next Subtable | Number of Symbols | Symbols |
| 000 | root | 3 | ①,①,① | root | 3 | ①,①,① |
| 001 | 7 | 2 | ①,① | 7 | 2 | ②,① |
| 010 | 8 | 1 | ① | 8 | 1 | ② |
| 011 | root | 2 | ①,⑥ | root | 2 | ②,⑥ |
| 100 | root | 1 | ② | root | 1 | ③ |
| 101 | 9 | 0 | — | root | 1 | ④ |
| 110 | root | 2 | ⑥,① | root | 2 | ⑤,① |
| 111 | 7 | 1 | ⑥ | 7 | 1 | ⑤ |

Table 7: Lookup Table for the First Unit

| Offset | First Subtable | Number of Redundant Symbols |
|---|---|---|
| 0 | root | 0 |
| 1 | root | 1 |
| 2 | root | 2 |

FIG. 12

Table 8: Total Table Size and Execution Time

| | | Encoder | | | Decoder | |
|---|---|---|---|---|---|---|
| | | General | Offset-based | Byte-based | Clustering | Byte – based |
| Total Table Size (bytes) | | 177 | 1,336 | 59,960 | 4,100 | 67,998 |
| PowerPC 8500 | Associated (sec) | | 13.97 | 12.06 | 13.65 | 6.83 |
| | Uniform (sec) | | 17.92 | 10.44 | 19.20 | 11.36 |
| HP 7000 | Associated (sec) | | 23.20 | 11.74 | 25.23 | 9.92 |
| | Uniform (sec) | | 26.10 | 14.10 | 33.17 | 16.17 |

FIG. 13

BYTE-BASED PREFIX ENCODING

BACKGROUND OF THE INVENTION

The present invention relates to a method for accelerating prefix encoding of data by byte-based machines. Although directed principally at software-only implementations, the method also can be employed in hardware or hybrid software/hardware prefix coders. The invention achieves significant improvement in encoding speeds at the sacrifice of increased storage requirements.

Prefix coding finds application to text compression, still image compression, fax compression, video compression, telemetry and related disciplines. Huff-man codes are a popular family of prefix codes that possess the desirable property of minimizing the average code word length (hence, maximizing the compression ratio) for data with a known probability distribution. Adaptive Huffman codes extend this property to situations in which the probabilistic mechanism governing the source output is not known a priori but can be estimated as the data stream unfolds.

Modifications of Huffman type prefix codes have been adopted in the widely deployed Group 3 and Group 4 facsimile standards and JPEG, H.263, H.320 and MPEG image and video standards. Common modifications include shortening the lengths of some of the Huffman code words for highly unlikely source symbols, protecting certain key code words (e.g., those representing end-of-line or end-of-block characters) from being misconstrued in the event that errors infiltrate the encoded bit stream during storage or transmission, bounding the maximum number of times in a row that a code symbol can be repeated in legitimately coded data in order to help maintain synchronization, ensuring that certain unique synchronizing sequences occur relatively frequently, forcing all code words to end with the same symbol, etc. The resulting so-called Modified Huffman codes sacrifice some of the compression ratio that would be achieved by a true Huffman code in order to provide one or more other properties deemed highly desirable in a given application.

The fact that successive code words having variable lengths get concatenated during prefix encoding makes prefix decoding an inherently bit-serial operation. More particularly, prefix decoding cannot be parallelized unless compression ratio is sacrificed by separating portions of the code stream from one another by a pattern of flag bits. Accordingly, prefix coding threatens to act as a bottleneck, especially in low-latency applications such as video conferencing, distance learning and telemedicine. The point is that, even though the bulk of the computations that need to be performed during the compression and decompression of images and video are devoted to two-dimensional transformation and motion estimation/compensation of image blocks, these computations can be parallelized in order to meet system latency requirements, but the prefix coding cannot.

This difficulty could be eliminated by using fixed-length rather than variable length codes, but then all the data compression ability would be lost with the likely result that whatever computational time might thus have been saved would be lost back during transmission. Hence, the efficient implementation of prefix encoding and decoding is a key component of the design of systems involving data compression, especially when a low latency requirement is imposed.

The bit-serial nature of prefix coding is particularly debilitating when the computations are performed by byte-based machines such as microprocessors or general purpose computers as opposed to by special purpose hardware. For example, whereas digital hardware can right-shift a bit stream in about a nanosecond, today's byte-based machines need to perform approximately a dozen logical operations in order to accomplish this, each of which requires several machine cycles; therefore, even a machine clocked as fast as 200 MHZ will require between ten and a hundred times longer to bit shift a data stream than would special-purpose digital hardware.

Nonetheless, there are compelling reasons to perform prefix coding on byte-based machines. One is that compression systems can be marketed and distributed nearly for free via the Internet and the world wide web provided they are software-only. Another is that it is easier to adapt to the statistics of the specific data sources one encounters in practice if the code is realized in software as opposed to hardware. Moreover, computer platforms today frequently receive compressed fax, image and video files via either downloads or external drives. In many applications there is a need to retrieve and display such material quickly. In such instances it would be advantageous to use byte-based techniques to decode the prefix-encoded portions of the compressed representations, even though such applications are not low-latency ones in which the encoding has been done only fractions of a second earlier. The gap between bytes and bits in software implementation of prefix decoders often has been bridged by means of stored, byte-addressable look-up tables; sometimes provision is made to update these tables in accordance with the empirically observed source statistics.

Although the gap between bits and bytes in prefix encoders also could be bridged similarly by means of stored encoding tables, this has not been done in practice. One reason is that many applications involve multicasting, i.e, are characterized by one encoder/transmitter servicing many decoders/receivers, as in the cases of web servers and video-on-demand. In such instances the encoder is an expensive, high-powered machine that is likely to contain special-purpose digital hardware to perform the prefix encoding operations. Another is that image and especially video encoding is so computationally demanding that encoders for low latency operations have had to be realized via special purpose hardware in order to keep up with the data stream. Hence, whereas software-only decoders (e.g., ones compatible with the MPEG1, MPEG2, H.261 and H.320 video decoding standards) have been implemented and widely disseminated, software-only encoders have not. However, rising interest in duplex, low-latency video applications such as teleconferencing, distance learning and telemedicine, coupled with increasing computer speeds and/ or new encoding algorithms of considerably reduced complexity, have combined to make software-only encoding a viable endeavor. A need has therefore been created for a byte-based software-only encoding scheme for prefix encoding data streams. The present invention meets this need.

SUMMARY OF THE INVENTION

The present invention satisfies the foregoing need through provision of two software-only prefix encoding techniques. Both techniques employ encoding look-up tables to produce contributions to the encoded bit stream that are incremented in integral numbers of bytes to facilitate accelerated encoding rates at the expense of an acceptable trade-off in increased memory size requirements. The first technique, referred to as offset-based encoding, employs encoding tables which eliminate most of the bit-based operations that need to be performed by a prefix encoder without inordinately expanding memory requirements. The second technique, referred to as byte-based encoding, employs encoders which eliminate all bit-based operations, except for a few performed only during initialization and termination; however, this is achieved at the expense of a considerable expansion in memory requirements. Given the dramatic decreases of late in memory prices and memory access times, the achievement of a significant decrease in encoding time may be deemed important enough in many of the aforementioned applications to justify a considerable increase in memory requirements.

In offset-based encoding, a Huffman table is employed which contains information for each number of bits by which the length of a Huffman word is offset from an integral number of bytes. The encoding method generates bytes of encoded data, even though the Huffman code has variable length code words for each symbol to be encoded. To do this, the encoding scheme keeps track of how many bits in a byte to be encoded correspond to the remainder of the code word for the previously encoded symbol. For example, if a previously encoded symbol required two bits of the present byte, then the encoding scheme automatically refers to a look-up table in memory having a two bit offset, i.e., the first bit of the next symbol is the third bit in the byte. For each possible symbol, the table therefore contains the values of the bytes which are necessary to encode the symbol for each possible offset. Each of the entries in the table contains a number of bytes necessary to encode the symbol with the designated offset, plus an extra byte containing all zeros in the event that the number of bits in the symbol and the designated offset exactly equals an integral number of bytes. The first byte in the table, which includes leading zeros in the offset positions, is then logically ORed with the last byte in the table entry for the previously encoded symbol to generate the next encoded byte of data. In the event that the total bit length of the offset and the encoded symbol is less than the byte length, this procedure is repeated until the entire byte is encoded. Once the byte is encoded, the next byte is encoded using the same procedure. Except for the bit-based ORing step, the offset-based encoding procedure does not employ time consuming bit-based operations.

The second preferred embodiment employs a byte-based Huffman encoding table which operates even faster than the offset-based encoding scheme because it does not employ any bit-based operations at all. In this scheme, a subtable is provided for each possible offset, and for each possible code combination which may be present with each offset. For example, an offset of two can have four possible conditions for the first two digits, (0,0), (0,1), (1,0), and (1,1). Thus, four tables are provided, one for each of the four conditions with an offset value of two, and each of the tables contains the identity of the next subtable to be referenced, as well as any fully encoded bytes which result from encoding of the designated symbol. This technique therefore completely eliminates the necessity of logically combining the last byte of a previously encoded symbol with the first byte of a presently encoded symbol in order to determine the contents of any transition bytes containing encoded portions of more than one symbol. Instead, the subtable for a presently encoded symbol indicates the subtable which must be employed to encode the next symbol by specifying the number of offset bits and their values. Obviously, this scheme greatly increases memory size requirements due to the large number of required subtables; however, experiments have confirmed that the operational speed of the byte-based encoding scheme is faster still than the offset-based encoding scheme.

BRIEF DESCRIPTION OF THE DRAWINGS

The features and advantages of the present invention will become apparent from the following detailed description of a number of preferred embodiments thereof, taken in conjunction with the accompanying drawings, in which.

DETAILED DESCRIPTION OF THE PREFERRED EMBODIMENTS

Figure 1:
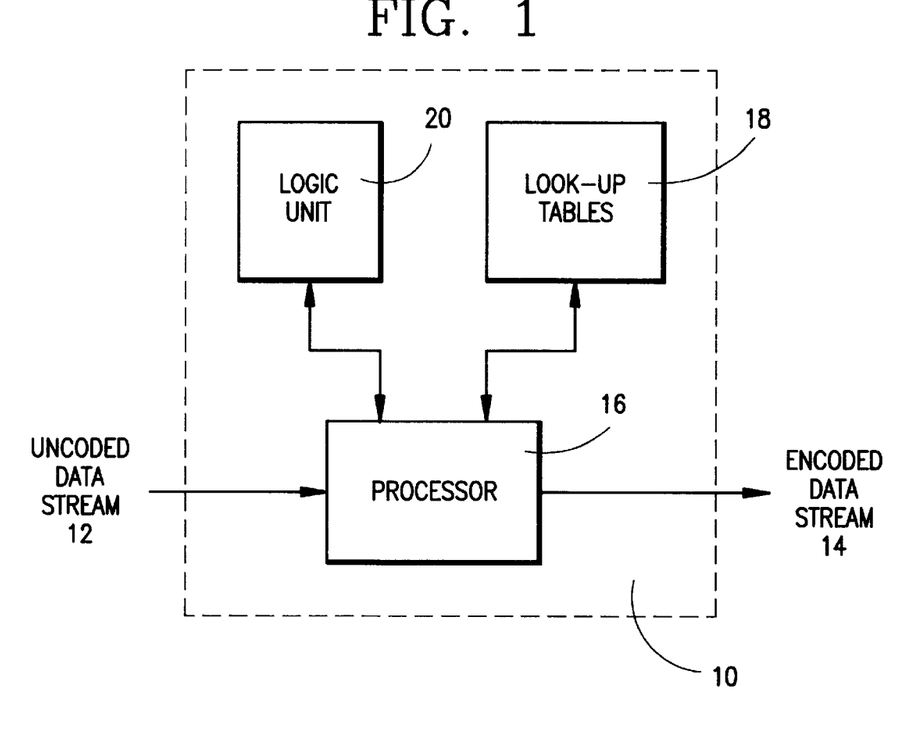
FIG. 1 is a general block diagram of a prefix encoder constructed in accordance with the preferred embodiments of the present invention.

With reference to FIG. 1, a prefix encoder 10 is illustrated which is constructed in accordance with either the first or second preferred embodiments of the present invention. As is conventional, the encoder 10 receives an incoming binary data stream 12 to be encoded or compressed, and compresses it through encoding to form an encoded binary data stream 14 containing substantially fewer corresponding bits than the original data stream 12.

A processor 16 performs the actual encoding by performing table look-up operations with a plurality of look-up tables 18 for each byte of data in the data stream 12. In the first preferred embodiment of the invention described in greater detail below, the encoder 10 also includes a logic unit 20 which enables the processor 16 to carry out necessary bit-by-bit comparisons during the encoding operation. The second preferred embodiment of the present invention employs only byte-based operations, and does not utilize the logic unit 20.

Preferably, the encoder 10 is implemented using only software so that it is easier to adapt to the statistics of the specific data sources with which the encoder 10 is employed. In addition, a software-only encoder can easily be distributed via the Internet, for example. However, it will be understood that the encoder 10 could also be implemented using hardware elements if desired.

Figure 2:
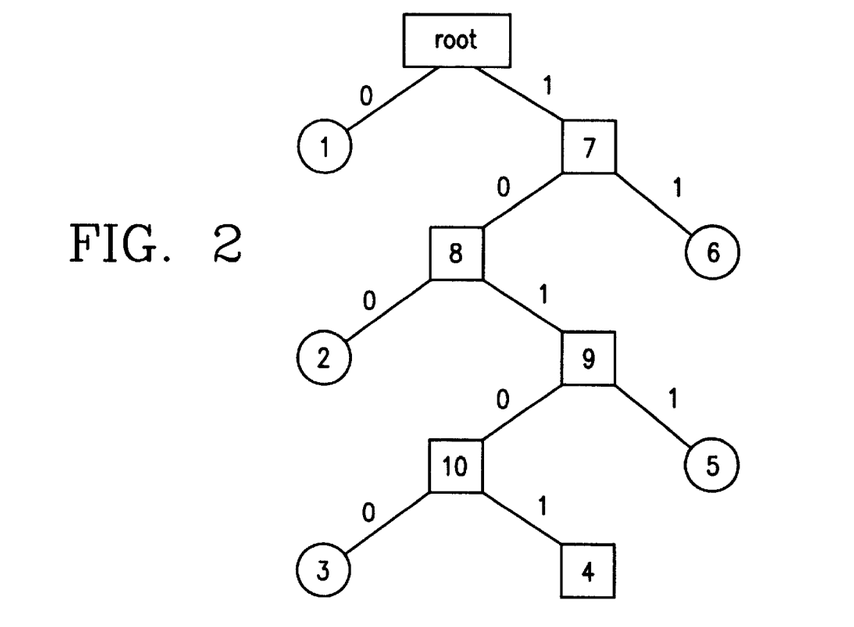
FIG. 2 is a binary tree for an example Huffman prefix code employed to illustrate the encoding techniques for the preferred embodiments of the present invention.

The preferred embodiments of the present invention will be illustrated by applying them to an example Huffman code, the binary tree of which is shown in FIG. 2. This tree has 6 leaves shown as circles and 5 internal nodes (including the root) shown as rectangles. The tree shall be referred to as a binary Huffman tree, though all that is said from here on applies to a general, possibly non-binary variable length prefix code, even one embedded in a tree that cannot be a Huffman code tree for any source probabilities. In particular, the subject coding implementations are applicable to the modified Huffman codes used in the Group 3 and Group 4 standards for facsimile compression, to fax-based video codes that use compression engines similar to those of Group 3 and Group 4 fax, to the JPEG standard for image compression, and to the H.263 and MPEG standards for video compression.

Figure 3:
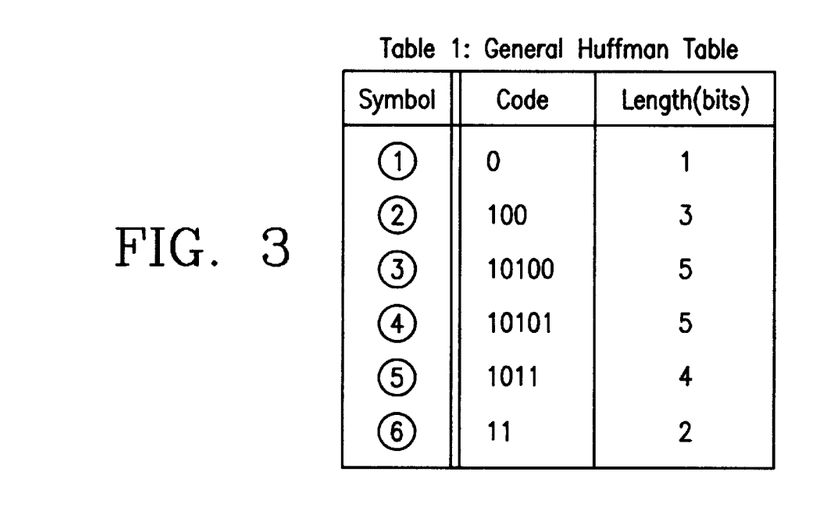
FIG. 3 is a general Huffman table for the example Huffman code of FIG. 2.

Prefix encoding usually is effected in the current state-of-the-art by means of what will be referred to as a general Huffman table. Table 1 illustrated in FIG. 3 shows the general Huffman Table for the tree of FIG. 2. Successive symbols are encoded by referring to Table 1 and concatenating their variable-length binary code words to form the bit stream. This ongoing bit-based operation poses a potentially serious bottleneck if one seeks a fast software-only implementation of the encoder on a byte-based computing platform.

Turning now to the details of the first preferred embodiment of the present invention, a new Huffman encoding table is employed therewith which will be referred to as the offset-based Huffman table. To address the gap between bits and bytes in software, the offset-based Huffman table contains information for each number of bits by which the length of a Huffman word is offset from an integral number of bytes.

Figure 4:
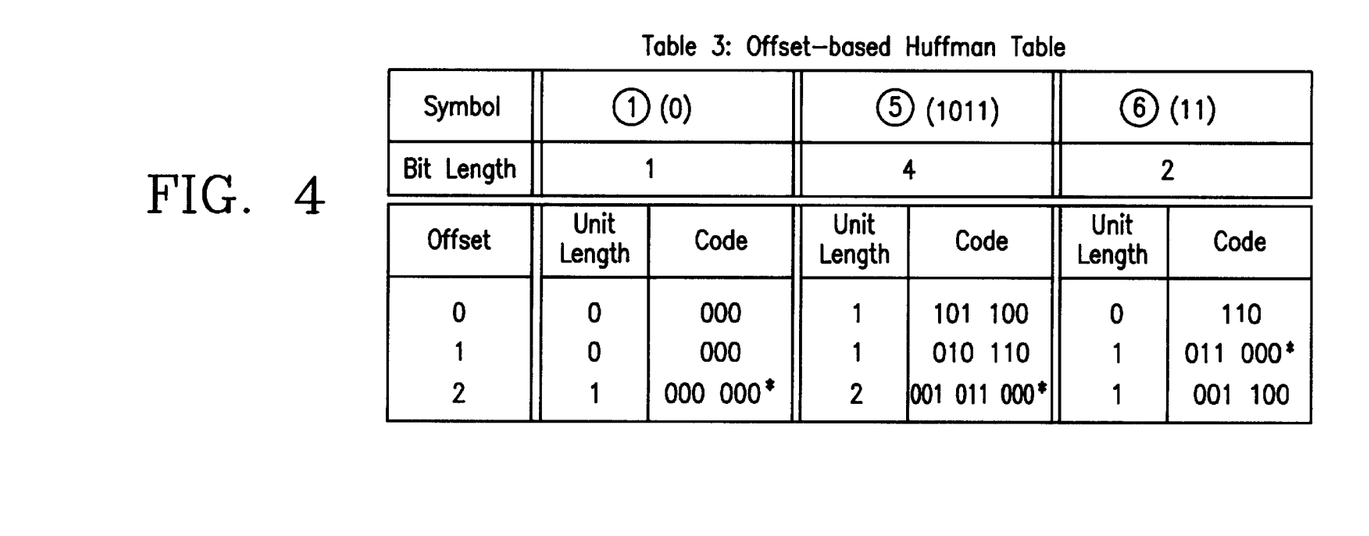
FIG. 4 is a Huffman table for encoding data using the example Huffman code in accordance with a first preferred embodiment of the present invention.

Table 3 illustrated in FIG. 4 is the portion of the offset-based Huffman table for the example code tree of FIG. 2 for symbols ①, ⑤ and ⑥ when a block of M=3 bits is used as the basic unit, in which case there are three possible offsets –0, 1 and 2 (For simplicity of exposition, m=3 is used as the unit in this discussion. It should be understood, however, that all of the tables and procedures described herein can be extended easily from 3 bits to 8 bits.). For each source symbol this table prescribes unit length and code information for each of the three offsets. The entries in the Code subcolumn are simply the Huffman code word for the source symbol right-shifted by the amount of the offset, preceded by leading zeros equal in number to the offset. If said right-shifted Huffman code word either ends immediately before a new M-bit unit or extends part way into a new M-bit unit, the entirety of that new M-bit unit appears in the Code column with trailing zeros filling in the portion of it to the right of where the Huffman code word ended. The entry in the Unit Length column is one less than the number of M-bit units that appear in the Code column. It equals the number of M-bit units that will be shifted out of the encoder as a result of having encoded the current symbol, namely all but the rightmost one in the Code column. For bookkeeping purposes a pointer value is maintained that keeps track of the running total number of M-bit units that have been transmitted as illustrated in FIGS. 5A–D.

The encoding procedure for the offset-based Huffman table is as follows:

Step 1: Initialization. If k of the M bits of the current unit already have been filled in by the final digits of whatever procedure just relinquished control of the bit stream to the need to encode new source symbols, set the offset to k. Make sure the remaining M−k bits of the current unit are zeros.

Step 2: Logical OR. Refer to the column of the table corresponding to the first source symbol to be encoded and to the row corresponding to the offset. Update the current unit by logical ORing it with the first unit in the Code subcolumn.

Step 3: Output Units. If the unit length U in the table is more than 0, output the current unit followed by all but the final unit in the Code subcolumn and update the current unit by setting it equal to the final unit in the Code subcolumn.

Step 4: Update the pointer and offset as follows:

pointer=pointer+unit length.

offset=(offset+bit length) mod M.

If one or more symbols remain to be written, go to Step 2. Otherwise, halt.

Figure 5A:
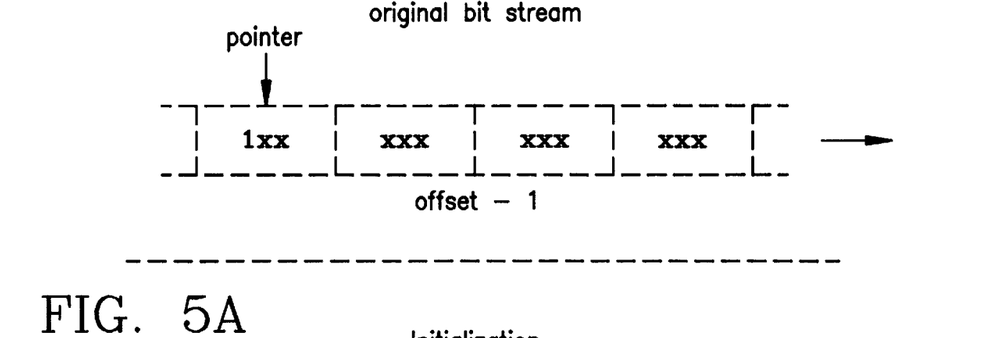
FIGS. 5A–D are data streams illustrating the operation of the first preferred embodiment.
Figure 5B:
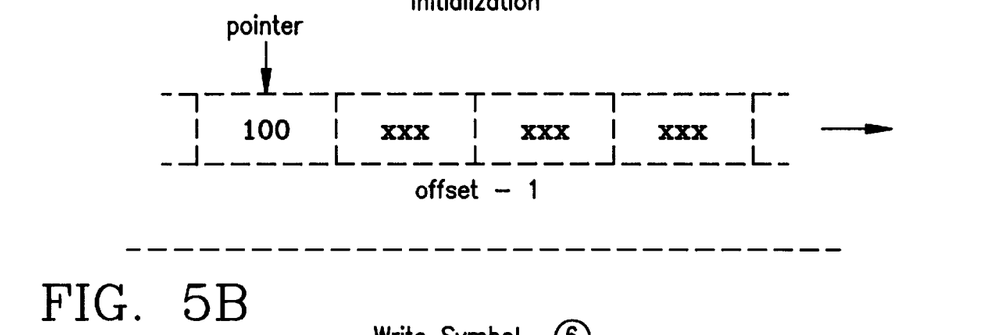

Including the all-zero units marked "*" in Table 3 eliminates the necessity, after initialization has been completed, to clear the current unit each time Step 2 is invoked. FIGS. 5A–D provide an illustrative example of encoding using the above offset-based Huffman table. More particularly, FIG. 5A shows an original bit stream in which the pointer is pointing to a byte, the first bit of which has already been encoded, thus setting the offset to 1. In FIG. 5B, the encoding is initialized by temporarily placing zeros in the remaining bits of the byte.

Figure 5C:
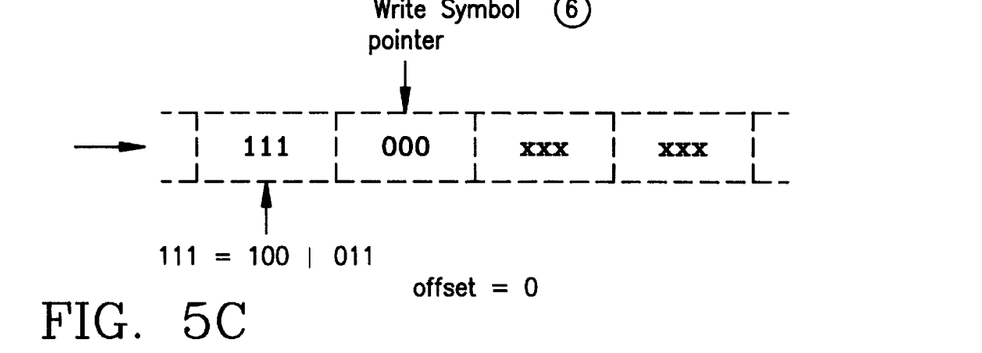
Figure 5D:
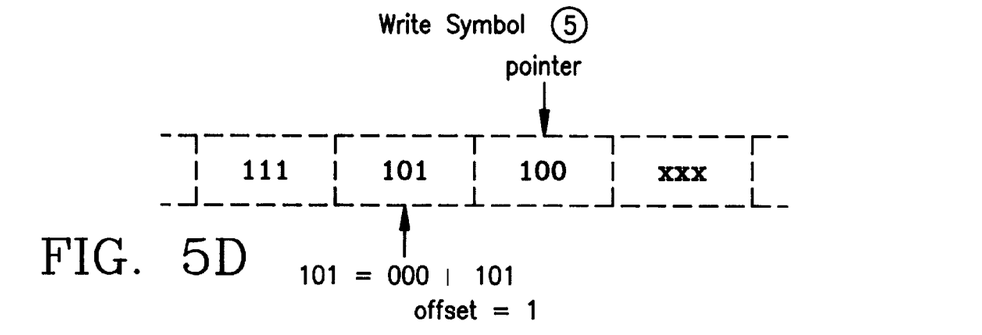

In FIG. 5C, the symbol 6 (11) is encoded by logically ORing 100 with 011, thereby setting the encoded byte to 111, and setting the offset to zero for the next byte to be encoded. Three zeros are then temporarily placed in the next byte to be encoded since the previous encoding operation set the offset to zero. Next, in FIG. 5D, the symbol 5 (1011) is encoded by first logically ORing 000 with 101, the first three bits of the symbol, thereby generating a first encoded byte of 101. The first bit of the next byte is then set to 1 to finish encoding the symbol, and the offset is set to 1 for the next encoding sequence.

The number of rows in the offset-based Huffman table is M times that of the general Huffman table. However, when one unit is one or two 8-bit bytes (M=8 or M=16, respectively) the size of the offset-based Huffman table still is comfortably small because the general Huffman table usually is small relative to the typical memory sizes of today's machines.

Figure 6:
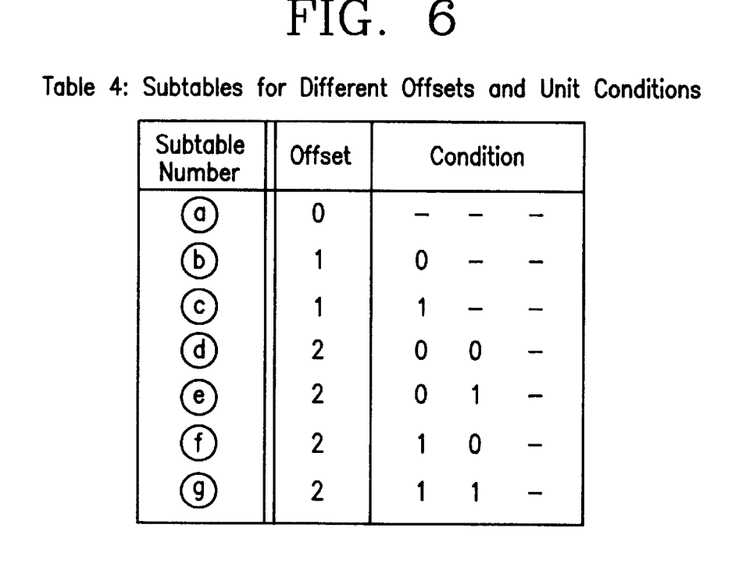
FIG. 6 is a table illustrating subtables for different offsets and unit conditions which are employed in a encoding technique in accordance with a second preferred embodiment of the present invention.

The second preferred embodiment of the present invention employs another new Huffman table, which will be referred to as the byte-based Huffman table. Compressed code is written in M-bit units when the byte-based Huffman table is used, as was the case with the offset-based Huffman table. However, the offset-based Huffman table requires bit operations to be performed in order to update the offset and the condition of the current unit, whereas the byte-based Huffman table avoids bit operations entirely. Toward this end, a unique subtable is first associated with each offset and unit condition as shown in Table 4 of FIG. 6.

Figure 7:
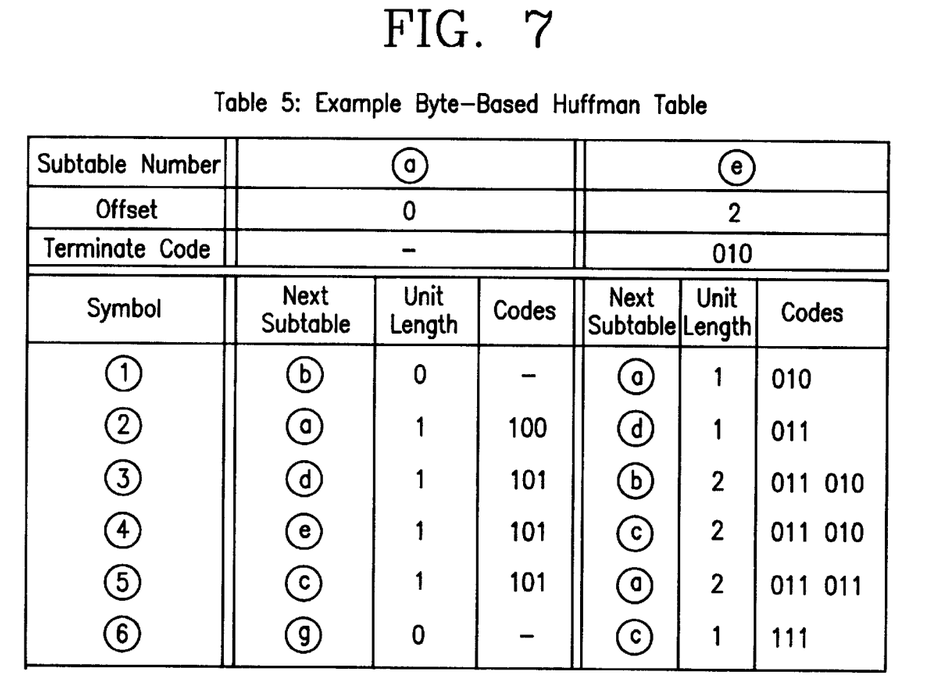
FIG. 7 is a table illustrating the use of the example Huffman code for encoding data in accordance with the second preferred embodiment of the present invention.

Table 5 in FIG. 7 shows two of the seven subtables of the byte-based Huffman table for the example Huffman code, namely subtables a and e. The first row of each subtable contains the offset that corresponds to that subtable. The second row shows a terminate code, which is simply the unit condition associated with that subtable with trailing zeros added to make a complete M-bit unit; the terminate code gets invoked only after encoding of the final source symbol. The remaining rows give, for each possible symbol from the source, the unit length, the output code(s) and next subtable.

Encoding with the byte-based Huffman table proceeds as follows:

Step 1: Initialization. Set the subtable number by referring to the offset and the condition of the current unit.

Step 2: Refer to the row of the subtable that corresponds to the source symbol to be encoded. If the unit length is more than 0, write the M-bit words in the Codes column to the output and then update the subtable number. If there still are symbols to encode, repeat this step. Otherwise go to Step 3.

Step 3: Termination. Write the terminate code and handoff the offset value to the following procedure.

The storage required for the byte-based Huffman increases exponentially with M because there are, in general, $\Sigma 2^i$, i=0, . . . , m−1=$2^M$−1 subtables. Therefore, the total number of the entries in the byte-based Huffman table is $N(2^M-1)$ where N is the number of source symbols. When N is small and M is set to 8, the total size of the byte-based Huffman table is still reasonable. However, when N is large, the offset-based Huffman table is better both in coding time and in memory space since the time to access the memory usually becomes bigger as the size of the table increases.

The state-of-the-art decoder usually is implemented by constructing a look-up table. The general look-up table would need to have an entry for each of the $2^L$ binary L-strings, where L is the depth of the tree (i.e., the length of the longest word in the code). This is because it is possible that as many as L bits will have to be consulted in order to decode the next symbol. In sensibly constructed codes, moreover, words of length near L occur highly infrequently, which makes it all the more undesirable to have to use a decoding table whose size increases exponentially with L. For example, the Modified Huffman code tree used in the Group 3 fax standard for the lengths of white runs has depth 12, requiring a general look-up table with 4096 entries, but the tree has only 91 leaves, 64 corresponding to so-called terminating codes and 27 to so-called make-up codes.

To address the problem of exponential growth of the size of the decoder look-up table as a function of the maximum code word length, the technique of Clustering has been employed in the prior art. With clustering, the tree is partitioned every M levels and is divided into several subtrees. Then a separate look-up table is constructed for each of the subtrees instead one large table for the whole original tree.

Figure 8:
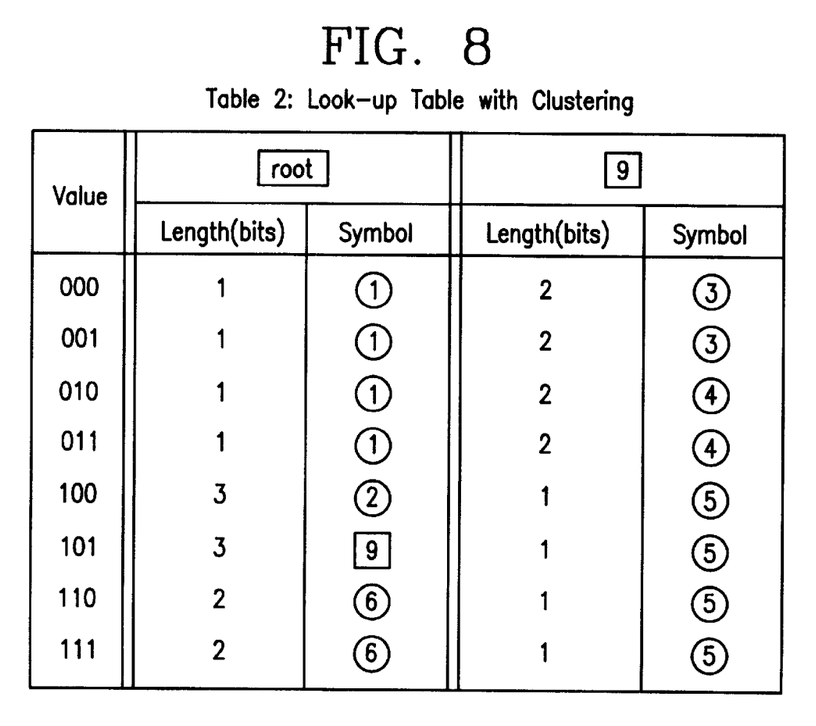
FIG. 8 is a look-up table for decoding symbols in accordance with the example Huffman code using three bit clustering.

Table 2 illustrated in FIG. 8 shows the simplified look-up tables for the code tree of FIG. 2 with clustering. The clustering unit M is selected to be 3 bits, and there are only two look-up tables, one for the subtree of depth 3 stemming from the root and the other for the subtree of depth 3 stemming from node 9. Each look-up table with clustering has $2^M$ entries ($2^3$, or 8, in this example). The number of look-up tables with clustering depends highly on the structure of the tree. The more sparse the tree is, the fewer the number of tables.

The decoding procedure for a look-up table with clustering is as follows.

Step 1: Initialization. Set the current table to [root].

Step 2: Read the next M bits from the bit stream, and refer to the line in the current table indexed by these M data bits. If the corresponding symbol is an internal node, set the current table to the table that corresponds to this node and repeat this step. If the corresponding symbol is a leaf, go to the next step.

Step 3: Output the symbol corresponding to said leaf, shift out of the bit stream a number of bits corresponding to the depth of this leaf, and set the current table to [root]. If there are still symbols to be decoded, go to Step 2. Otherwise terminate the procedure.

Clustering using a small value of M significantly reduces the look-up table storage requirement and usually speeds decoding as well compared with using the general decoding tree. However, the data still need to be read in M bits at a time, which is inefficient for M<8. (Some computers have hardware that supports efficient reading of 4-bit units called nibbles.) Furthermore, what is particularly significant here is that in Step 3 a bit-based operation is called for, namely shifting the input bit stream by l modulo M positions, where l is the length of the code word for the symbol being decoded.

Figure 9:
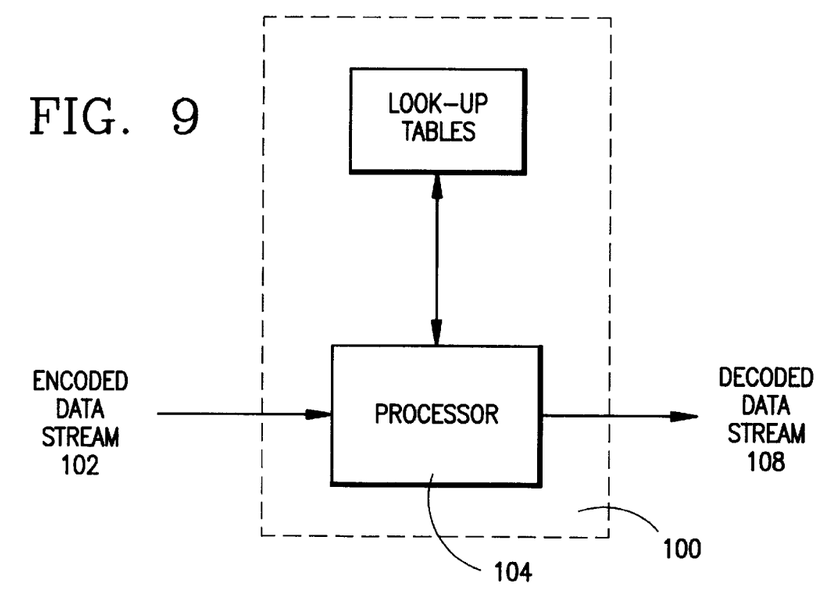
FIG. 9 is a general block diagram of a decoder for decoding prefix encoded data streams using byte-based look-up tables.

FIG. 9 illustrates a decoder 100 which may be used for decoding data streams which have been encoded with any prefix encoders, including, but not limited to, those constructed in accordance with the first and second preferred embodiments of the present invention. An incoming encoded (compressed) data stream 102 is fed into a processor 104 which employs only byte-based operations to access a plurality of look-up tables 106, and to generate a decoded (decompressed) data stream 108.

Figure 10A:
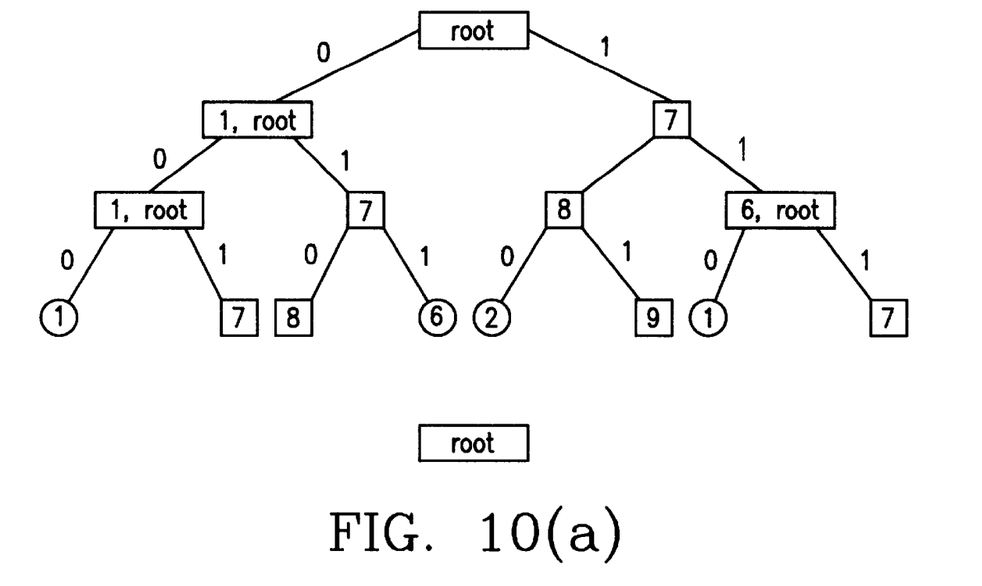
FIGS. 10A and 10B are examples of binary Huffman trees which are employed to illustrate the operation of the decoder of FIG. 9.
Figure 10B:
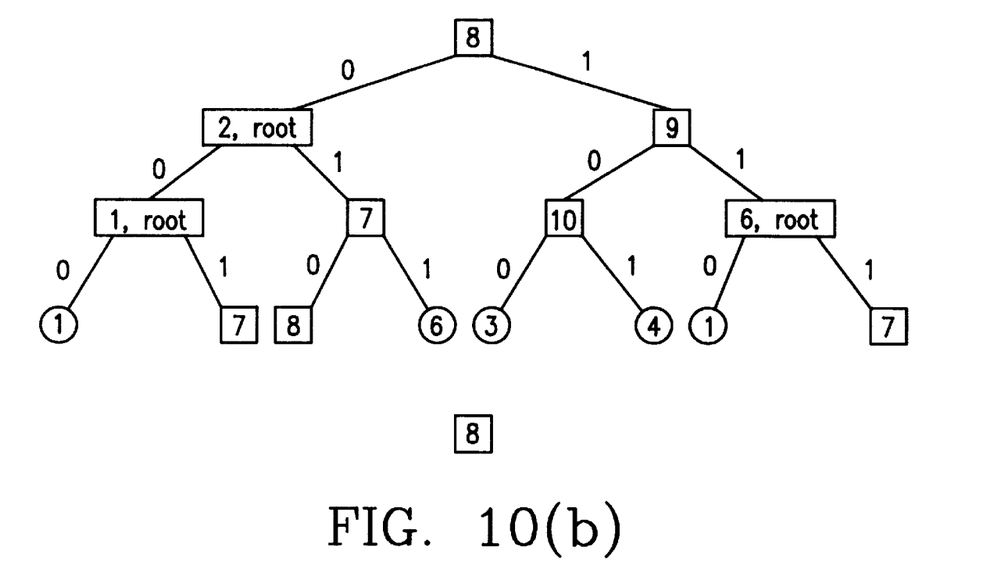

The look-up tables 106 are constructed using extended Huffman trees. One extended tree is constructed for each non-terminal node in the original Huffman tree. FIGS. 10A and B show the extended trees for the [root] and for node [8] of the tree for the example code. The extended tree for a node is rooted at that node in the original Huffman tree and is constructed by replacing each leaf deeper than that by the entire original tree until the depth of the extended tree becomes M.

Figure 11:
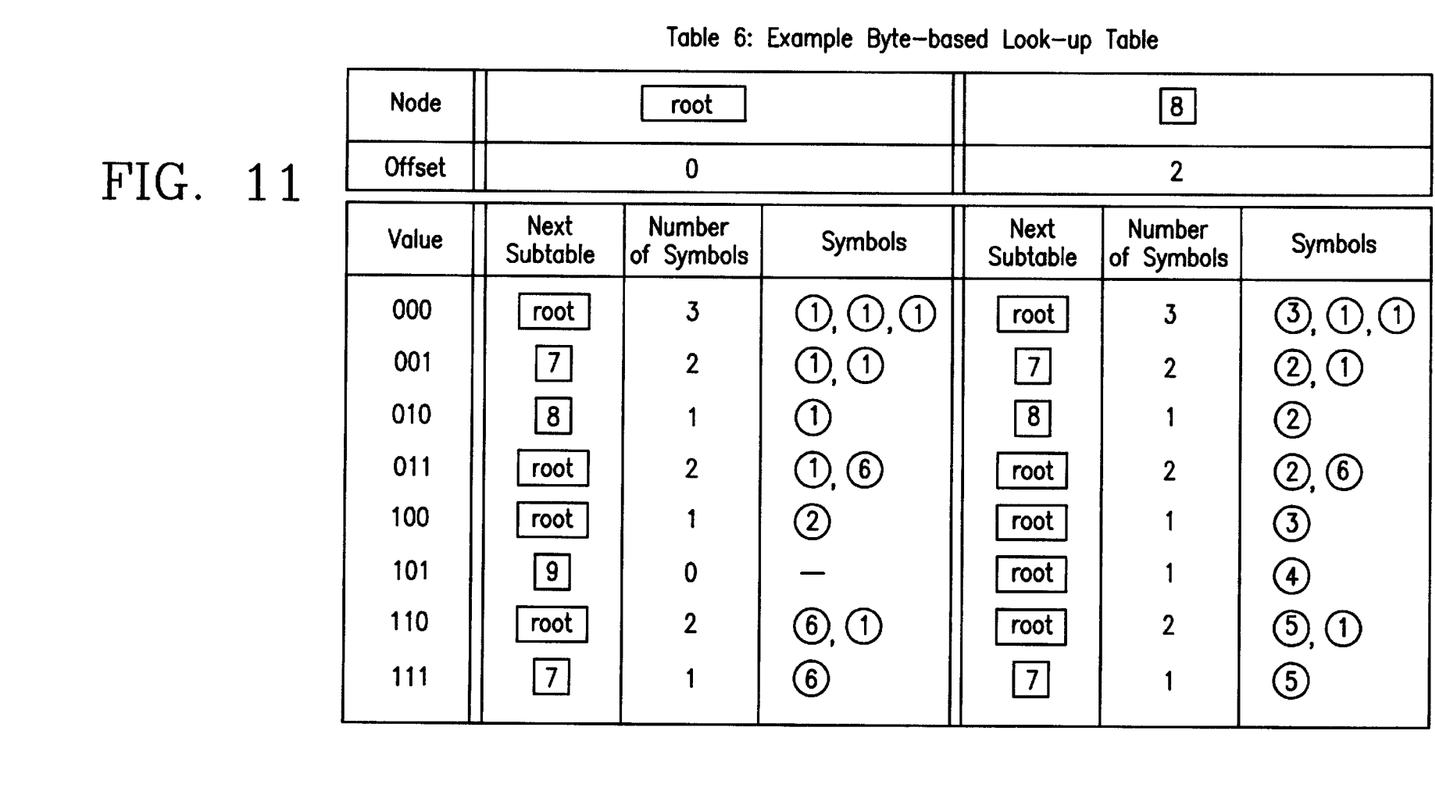
FIG. 11 is an example of a byte-based look-up table which may be employed by the decoder of FIG. 9 for decoding encoded data using the example Huffman trees of FIGS. 10A and 10B.

The byte-based look-up table is constructed with reference to the extended trees. Table 6 in FIG. 11 shows the subtables of the byte-based look-up table for the example that handle nodes [root] and [8]. Each byte-based look-up subtable contains an offset plus information for each M-bit byte value that describes the number and identity of the symbols decoded and the subtable to be used next. The offset for a node's subtable is the value of that node's depth in the original tree calculated modulo M. The next subtable is the one for the node at the bottom of the extended tree that one reaches by following the path specified by the value of the M-bit byte; if that node is a leaf, the next subtable is the one for [root].

Since a binary tree with N leaves has N−1 internal nodes (including the root), there are N−1 subtables, where N is the number of source symbols. Each byte-based look-up subtable contains $2^M$ entries. Therefore, the total number of the entries in the byte-based look-up table is $2^M$ (N−1).

The byte-based look-up table decoding procedure is as follows.

Step 1: Initialization. See the text below for details.

Step 2: Read one unit (usually one byte) from the encoded data stream and refer to the corresponding entry in the table. Decode the indicated symbols.

Step 3: Increase the pointer of the buffer by one unit and update the subtable number. If there still are symbols to decode, go to Step 2. Otherwise, go to Step 4.

Step 4: Termination. See the text for details.

For initialization, one more table is needed. The initialization table for the example is Table 7 illustrated in FIG. 12. This table specifies the first subtable and the number of redundant symbols for each offset.

Figure 12:
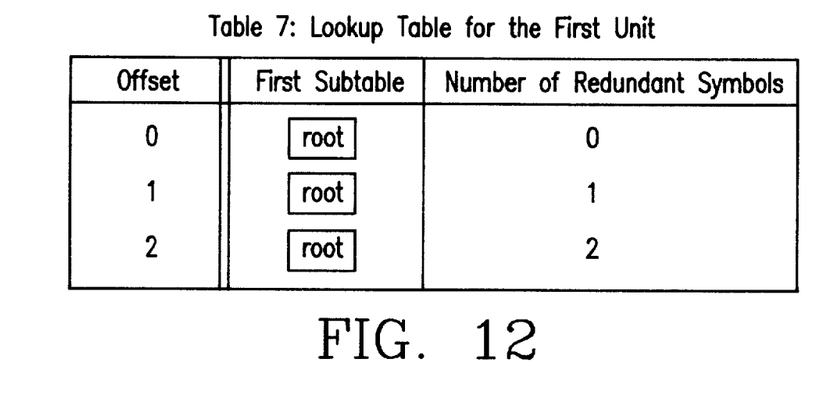
FIG. 12 is a look-up table which is employed by the decoder of FIG. 9 during initialization when the first byte of encoded data is to be decoded.

Initialization is illustrated for the same example that has been employed throughout, using a case in which the data starts with the unit "1xx". The offset of this unit is 1. Referring to the offset-1 entry in Table 7, the first subtable is set to [root] and the number of redundant symbols is set to 1. Then "1xx" is changed to "0xx" by bit operations. Suppose the first two data bits to be decoded are "xx"="00". Referring to row 000 of the first subtable [root] in Table 6, the corresponding symbols are 1, 1, 1. Ignoring the first symbol because the number of redundant symbols is 1, the decoded symbols for the first unit are thus ①,①. When the offset is 0, the first table is always [root] and the number of redundant symbols is 0 regardless of the structure of the tree. Therefore, the table is set to [root] when the offset is 0 and no bit operations are performed.

When decoding terminates, the current offset has to be handed off to whatever procedure follows. That offset is the one associated with the final subtable. For example, if Table 6 indicates that the current subtable is 8 but then there are no more units to decode, reference to the offset for subtable 8 in Table 6 indicates that the handoff offset is 2.

The major advantages of the byte-based look-up table are that bit operations are eliminated (once initialization is finished) and that plural symbols can be decoded simultaneously. For example, the decoded symbols associated with value "000" in the [root] subtable are ①,① and ①. Accordingly, three symbols are decoded at once whenever the current subtable is [root] and the byte value to be decoded is "000". Contrastingly, if the general look-up table were used, it would need to be consulted three times in order to output these three decoded symbols. Moreover, since Huffman coding allocates shorter code words to more probable source symbols, the probability is high that more than one symbol can be decoded at one time. Whereas the general look-up table needs to be consulted circa K times in order to decode K symbols from the source, the byte-based look-up needs to be consulted only circa (K·H)/M times where H is the entropy rate of the data measured in bits per source symbol.

Simulations were conducted which confirm the performance gains of the proposed encoding and decoding tables. The simulations included the general Huffman table, offset-based Huffman table, byte-based Huffman table, general look-up table with clustering, and byte-based look-up table. Said tables were constructed for the depth-13 tree with 32 leaves (symbols). The encoding and decoding procedures were repeated for 10,000 blocks of 8192 symbols from each of two simulated data sources, one that has equiprobable symbols and another that has the distribution associated with the depth-13 Huffman tree in question.

Figure 13:
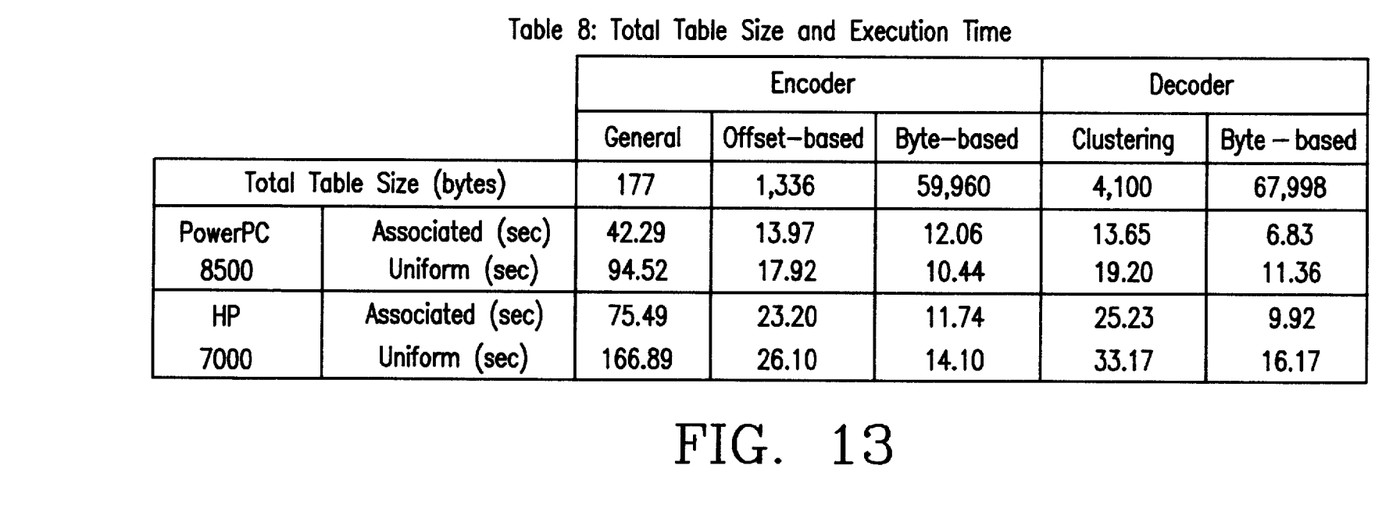
FIG. 13 is a table which compares operational performance of prior art prefix encoders and decoders with prefix encoders and decoders constructed in accordance with the preferred embodiments of the present invention.

Two platforms were used, a MACINTOSH 8500 with 120 MHz POWERPC 604 chip and 16 MB memory and an HP 7000 workstation. Table 8 in FIG. 13 shows the total table size and the execution time of each table. The PPC 8500 execution times include the time to read the data from the buffer, encode/decode the data, and write the data into another buffer. However, they exclude the time to open and close the tables and to allocate the buffer. On the other hand, the execution times of the HP 7000 include everything and were determined by using the timex command. Both the combined effect of the other processes running concurrently on the HP 7000 and the time to open and close the tables and allocate the buffer on the POWERMAC were negligible (less than 0.5 sec).

It can be seen from Table 8 that the proposed encoding and decoding tables provide high-speed performance at the expense of increased memory requirements. Although large, the proposed tables still are reasonable to implement on today's computers. Some memory could be saved without adversely affecting performance by eliminating redundant parts of the proposed tables.

Encoding with new Huffman tables is more than three times as fast as with the general Huffman table in the example. It is especially noteworthy that, when the uniformly distributed data stream is considered, the execution time with the new tables remains stable whereas it more than doubles if one uses the general Huffman table. In this example decoding via byte-based look-up tables was approximately twice as fast as decoding by clustering. Simulations performed for a 128-symbol source alphabet yielded even stronger performance gains for the new tables than in the case of the 32-symbol source.

In many applications the statistics of the data to be compressed are unknown or incompletely known a priori. To cope with such situations, techniques have been devised that adaptively calculate successive approximations to the statistical model of the source as the data record unfolds. Examples are the adaptive Huffman text compression routine known as Compact that is a standard tool on most Unix operating systems, the Q-coder adaptivity scheme used in the JBIG facsimile standard JBIG91, and the context-tree weighing algorithm of Willems et al.

Software-only implementations of media compression algorithms offer the distinct advantage of flexibility in adaptation. Hardware implementations, by contrast, usually are limited to adapting only a small number of parameters to which special circuitry must be dedicated a priori; e.g., JBIG's arithmetic Q-coder can adapt only one pixel in each prediction context. So-called backward adaptive schemes are preferable in practice because they do not require separate information to be sent from the encoder to the decoder about the nature of the adaptations. In backward-adaptive schemes the encoder calculates the adaptations it will make in the way in which it will compress future data by using only data from the past (backward data) that already has been sent to the decoder. As it decodes the received compressed data stream, the decoder therefore always obtains all the ingredients it needs to implement the adaptation recipe in step with the encoder.

We disclose a backward-adaptive version of byte-based prefix coding. Assume that the encoder applies an adaptation algorithm that intermittently calculates a new prefix code that is felt to match the data better. This can be done either at periodic intervals or whenever the data string exhibits local statistics that do not agree well with those for which the prefix code currently in force was designed. The disagreement could be due either to a change in the statistics of the data source or to the fact that the estimated statistics currently in force were insufficiently accurate. In any case, if a backward-adaptive scheme is employed, the decoder will know when such encoder adaptations take place. Each time there is an adaptation, the encoding and decoding tables in use (offset-based, byte-based, clustering, or general Huffman as the case may be) need to be recomputed. Fortunately, all these tables are deterministic functions of the underlying prefix code, so incorporating adaptivity poses no insurmountable difficulty in principle. In practice, however, it may prove difficult to update the tables associated with a newly-adapted prefix code fast enough to keep pace with the data stream. Accordingly, fast algorithms for adaptation of the encoding and decoding tables are needed.

It is also desirable to write the software for byte-based prefix coding in such a way that it adapts ("ports") to different computer platforms and operating systems in an efficient manner. A smart implementation will take maximum advantage of the host computer's instruction set and architecture. Specifically, the trend toward 16-bit and 32-bit architectures with significantly larger cache and RAM will permit use of M>8 in the near future, which will yield concomitant increases in the speed of encoding and decoding. It will also permit block Huffman codes to be used that code n-tuples of data words into one leaf of the prefix code tree. Alternatively, instead of block-iterating the underlying Huffman code (there is a sense in which the encoding and decoding algorithms disclosed herein already do this to a limited but useful degree), we could use scalar-vector Laroiya Farvardin or trellis-coded Marcellin Fischer quantization techniques to convert the meaning of the leaves in our Huffman codes into the code words of a vector quantizing scheme that more accurately reflects the behavior of the underlying, possibly analog data source that the code words are designed to approximate.

In summary, the new prefix coding techniques enable data to be written and read in bytes rather than bits, thereby virtually eliminating the need for inefficient software simulation of bit-based operations. In experiments with 10,000 blocks of 8192 symbols from a source with an alphabet of 32 letters and a probability distribution for which the maximum-length binary prefix code word had 13 digits, the invention decreased encoding time by factors between 3 and 4 on several desk top computers relative to classical software-only prefix encoding. The invention has profound implications for the design of systems that use prefix codes to compress digital media. It is particularly useful for (but not limited to) media compression applications that are characterized by the need for low end-to-end latency and/or software-only implementation.

Although the invention has been disclosed in terms of a number of preferred embodiments, it will be understood that numerous modifications and variations could be made thereto without departing from the scope of the invention as set forth in the following claims.

What is claimed is:

1. A method for generating an encoded data stream from an uncoded data stream using a prefix code, said prefix code including a plurality of variable length code words, each of which is employed to encode a corresponding one of a plurality of symbols in said uncoded data stream, said method comprising the steps of:
   a) initializing encoding by identifying the binary values, if any, for s1 offset bits which are to be preset in a next b-bit byte to be generated in said encoded data stream, where s1=0 if there are no offset bits, and 0<s1<b if there are offset bits;
   b) selecting a symbol in said uncoded data stream to be encoded by a corresponding m-bit code word, where m>0 and can vary from symbol to symbol;
   c) if s1+m<b, concatenating the m bits of said code word with said offset bits, wherein the number of offset bits, s1, is increased to s1=s1+m; then returning to step b if another symbol in said uncoded data stream remains to be encoded;
   d) if s1+m≧b, determining the bit coding of the next n bytes to be encoded from the values of said offset bits and said bits in said code word, where n is the largest whole number less than or equal to (s1+m)/b;
   e) generating said next n bytes of said encoded data stream with said determined coding;
   f) if (s1+m)/b=n, and at least one symbol to be encoded is present in said uncoded data stream, setting the offset bits to 0 (s1=0), and returning to step b;
   g) if (s1+m)/b>n, setting said offset bits to the last (b(n+1))−(s1+m) bits of said code word, where s1 now equals (b(n+1))−(s1+m), and returning to step b if another symbol to be encoded remains in said uncoded data stream.

2. The method of claim 1, wherein the step of determining the bit coding of the next n bytes to be encoded further comprises:
   1) accessing a look-up table which contains a plurality of encoded byte entries, one for each code word/offset bit combination;
   2) determining the coding for the next n bytes of said encoded data stream from the encoded byte entry for said code word and offset bits.

3. The method of claim 2, wherein said step of accessing further comprises accessing a subtable in said look up table corresponding to said offset bits, said subtable including a plurality of said encoded byte entries, one for each of said code words.

4. The method of claim 3, wherein said subtable further includes an entry for each of said code words which indicates the identity of any offset bits in a next byte to be encoded which are necessary to complete encoding of said symbol, and the step of setting said offset bits to the last (b(n+1))−(s1+m) bits of said code word further comprises accessing said offset bits in said next byte from said subtable.

5. The method of claim 1, wherein the step of concatenating said m bits of said code word with said offset bits if s1+m<b further comprises:
   1) accessing a look-up table which contains a next offset bit entry for each code word/present offset bit combination, and
   2) setting said offset bits to said next offset bit entry corresponding to said code word/present offset bit combination.

6. The method of claim 1, wherein said prefix code comprises a Huffman code.

7. The method of claim 1, wherein the steps of determining the bit coding of the next n bytes to be encoded and generating said bytes further comprise:
   1) setting the first s1 bits of the next byte to be generated in said encoded data stream to the binary values of said s1 offset bits, and setting the remaining (b−s1) bits of the byte to 0;
   2) accessing a look-up table containing a plurality of encoded byte entries, one for each code word/number of offset bits combination;
   3) retrieving an encoding entry corresponding to said code word and the number of offset bits=s1, said entry comprising (n+1) bytes, a first of which is encoded with 0's for a first s1 bits, and the first (b−s1) bits of said code word for the remaining (b−s1) bits, and the next (n−1) of which are encoded with the next ((n×b)−(b−s1)) bits of said code word;
   4) logically ORing each bit in said first byte of said entry with each of the bits in said next byte to be encoded to generate said next byte: and
   5) setting said remaining n−1 bytes to the next n−1 bytes of said entry.

8. The method of claim 7, wherein the step of concatenating the m bits of said code word with said offset bits if s1+m<b, further comprises:
   1) accessing a look-up table containing a plurality of encoded byte entries, one for each code word/number of offset bits combination;
   2) retrieving an encoding entry corresponding to said code word and the number of offset bits=s1, said entry comprising a byte which is encoded with 0's for a first s1 bits, the bits of said code word for the next m bits, and 0's for the remaining b−(s1+m) bits remaining (b−s1) bits; and 3) logically ORing each bit in said byte of said entry with each of the bits in said next byte to be encoded so that said next byte now includes s1+m offset bits.

9. The method of claim 7, wherein said prefix code is a Huffman code.

10. An encoder for generating an encoded data stream from an uncoded data stream using a prefix code, said prefix code including a plurality of variable length code words, each of which is employed to encode a corresponding one of a plurality of symbols in said uncoded data stream, said encoder comprising:
 a) at least a first look-up table containing a plurality of encoded byte entries, each of said entries corresponding to a symbol in said uncoded data stream and a selected offset bit condition; and
 b) a processor for generating said encoded data stream by accessing said encoded byte entries from said look-up table, said processor including means for:
  1) initializing encoding by identifying the binary values, if any, for s1 offset bits which are to be preset in a next b-bit byte to be generated in said encoded data stream, where s1=0 if there are no offset bits, and 0<s1<b if there are offset bits;
  2) selecting a symbol in said uncoded data stream to be encoded by a corresponding m-bit code word, where m>0 and can vary from symbol to symbol;
  3) if s1+m<b, concatenating the m bits of said code word with said offset bits, wherein the number of offset bits, s1, is increased to s1=s1+m; then returning to step 2 if another symbol in said uncoded data stream remains to be encoded;
  4) if s1+m≧b, determining the bit coding of the next n bytes to be encoded by accessing an encoded byte entry in said look-up table corresponding to said offset bits and said symbol, where n is the largest whole number not exceeding (s1+m)/b;
  5) generating said next n bytes of said encoded data stream with said determined coding;
  6) if (s1+m)/b=n, and another symbol to be encoded is present in said uncoded data stream, setting the offset bits to 0 (s1=0), and returning to step 2;
  7) if (s1+m)/b>n, setting said offset bits to the last (b(n+1))−(s1+m) bits of said code word, where s1 now equals (b(n+1))−(s1+m), and returning to step 2 if at least one symbol to be encoded remains in said uncoded data stream.

11. The encoder of claim 10, wherein said look-up table includes a plurality of subtables, one for each offset bit combination, each of said subtables including a plurality of said encoded byte entries, one for each of said code words.

12. The encoder of claim 11, wherein said subtable further includes an entry for each of said code words which indicates the identity of any offset bits in a next byte to be encoded which are necessary to complete encoding of said symbol, and said means in said processor for setting said offset bits to the last (b(n+1))−(s1+m) bits of said code word further comprises means for accessing said offset bits in said next byte from said subtable.

13. The encoder of claim 10, wherein said look-up table further contains a next offset bit entry for each code word/present offset bit combination, and said means in said processor for concatenating said m bits of said code word with said offset bits if s1+m<b further comprises means for accessing said look-up table, and setting said offset bits to said next offset bit entry corresponding to said code word/present offset bit combination.

14. The encoder of claim 10, wherein said prefix code comprises a Huffman code.

15. The encoder of claim 10, wherein said look-up table contains an encoded byte entry for each code word/number of offset bits combination, and said means in said processor for determining the bit coding of the next n bytes to be encoded and generating said bytes further comprises means for:
 1) setting the first s1 bits of the next byte to be generated in said encoded data stream to the binary values of said s1 offset bits, and setting the remaining (b−s1) bits of the byte to 0;
 2) accessing said look-up table and retrieving an encoding entry corresponding to said code word and the number of offset bits=s1, said entry comprising (n+1) bytes, a first of which is encoded with 0's for a first s1 bits, and the first (b−s1) bits of said code word for the remaining (b−s1) bits, and the next (n−1) of which are encoded with the next ((n×b)−(b−s1)) bits of said code word;
 3) logically ORing each bit in said first byte of said entry with each of the bits in said next byte to be encoded to generate said next byte: and
 4) setting said remaining n−1 bytes to the next n−1 bytes of said entry.

16. The encoder of claim 10, wherein said means in said processor for adding the m bits of said code word to said offset bits if s1+m<b, further comprises means for:
 1) retrieving from said look-up table, an encoding entry corresponding to said code word and the number of offset bits=s1, said entry comprising a byte which is encoded with 0's for a first s1 bits, the bits of said code word for the next m bits, and 0's for the remaining b−(s1+m) bits; and
 2) logically ORing each bit in said byte of said entry with each of the bits in said next byte to be encoded so that said next byte now includes s1+m offset bits.

* * * * *